(12) United States Patent  (10) Patent No.: US 8,931,166 B2
Marttila  (45) Date of Patent: Jan. 13, 2015

(54) MANUFACTURING METHOD OF ELECTRICAL BRIDGES SUITABLE FOR REEL TO REEL MASS MANUFACTURING

(75) Inventor: Tom Marttila, Espoo (FI)

(73) Assignee: Tecnomar Oy (FI)

( * ) Notice: Subject to any disclaimer, the term of this patent is extended or adjusted under 35 U.S.C. 154(b) by 0 days.

(21) Appl. No.: 13/881,987

(22) PCT Filed: May 21, 2012

(86) PCT No.: PCT/FI2012/050475
§ 371 (c)(1),
(2), (4) Date: Apr. 26, 2013

(87) PCT Pub. No.: WO2012/156590

PCT Pub. Date: Nov. 22, 2012

(65) Prior Publication Data

US 2013/0220689 A1    Aug. 29, 2013

(30) Foreign Application Priority Data

May 19, 2011  (FI) ..................................... 20115488

(51) Int. Cl.
*H05K 3/00* (2006.01)
*H05K 3/46* (2006.01)
(Continued)

(52) U.S. Cl.
CPC ............... *H05K 3/46* (2013.01); *H05K 3/4685* (2013.01); *G06K 19/07749* (2013.01);
(Continued)

(58) Field of Classification Search
CPC .... H05K 1/0201; H05K 1/023; H05K 1/0243
USPC ............ 29/25.35–25.42, 846–847, 829–831; 340/572.1–572.9; 343/868, 700 MS; 361/736–737
See application file for complete search history.

(56) References Cited

U.S. PATENT DOCUMENTS 3,240,647 A    3/1966  Morgan ........................ 156/249
4,369,557 A    1/1983  Vandebult .................... 29/25.42
(Continued)

FOREIGN PATENT DOCUMENTS

DE    100 52 517 A1    2/2002
FI    121592    1/2011
(Continued)

OTHER PUBLICATIONS

International Search Report dated Sep. 25, 2012 issued in corresponding International Patent Application No. PCT/FI2012/050475.
Written Opinion of the International Searching Authority dated Sep. 25, 2012 issued in corresponding International Patent Application No. PCT/FI2012/050475.
English translation of Office Action dated Dec. 13, 2013 issued in corresponding Japanese Patent Application No. 2013-549860 (2 pages).

*Primary Examiner* — Minh Trinh
(74) *Attorney, Agent, or Firm* — Ostrolenk Faber LLP

(57) ABSTRACT

A manufacturing method of electrical bridges, wherein a conductive pattern (2) from electroconductive material, such as metal foil, is applied over a substrate (1) made of electrically insulating material and the electroconductive material has at least one strip tongue (3) unattached to the substrate, one side of the tongue is attached to the conductive pattern (2), and the said strip tongue (3) is folded over an area insulated electrically from the conductive pattern (2), and the strip tongue (3) is connected electroconductively to a predetermined other part (5) of the conductive pattern (2).

18 Claims, 4 Drawing Sheets

(51) Int. Cl.
*G06K 19/077* (2006.01)
*H01L 23/498* (2006.01)

(52) U.S. Cl.
CPC . *G06K 19/07783* (2013.01); *H05K 2201/1028* (2013.01); *H01L 23/49855* (2013.01); *H05K 2201/0397* (2013.01); *H01L 2924/0002* (2013.01)
USPC ............. 29/829; 29/592.1; 29/825; 174/261

(56) References Cited

U.S. PATENT DOCUMENTS

| | | | |
|---|---|---|---|
| 4,664,966 A | 5/1987 | Bailey | 428/203 |
| 4,717,438 A | 1/1988 | Benge | 156/152 |
| 4,745,288 A | 5/1988 | Hurley | 250/548 |
| 4,900,386 A | 2/1990 | Richter-Jorgensen | 156/250 |
| 5,142,270 A | 8/1992 | Appalucci | 340/572 |
| 5,161,276 A | 11/1992 | Hutton | 5/460 |
| 5,276,431 A * | 1/1994 | Piccoli et al. | 340/572.5 |
| 5,566,441 A | 10/1996 | Marsh | 29/600 |
| 5,645,932 A | 7/1997 | Uchibori | 428/347 |
| 5,656,115 A | 8/1997 | Tanno | 156/270 |
| 5,708,419 A | 1/1998 | Isaacson | 340/572 |
| 5,725,935 A | 3/1998 | Rajan | 428/195 |
| 5,751,256 A | 5/1998 | McDonough | 343/873 |
| 5,754,256 A | 5/1998 | Kim | 348/706 |
| 5,759,422 A | 6/1998 | Schmelzer | 216/35 |
| 5,800,724 A | 9/1998 | Habeger | 216/35 |
| 5,861,809 A | 1/1999 | Eckstein | 340/572 |
| 6,072,383 A | 6/2000 | Gallagher | 340/10.2 |
| 6,147,662 A | 11/2000 | Grabau | 343/895 |
| 6,164,551 A | 12/2000 | Altwasser | 235/492 |
| 6,191,382 B1 | 2/2001 | Damikolas | 219/121.62 |
| 6,259,369 B1 | 7/2001 | Monico | 340/572.8 |
| 6,265,977 B1 | 7/2001 | Vega | 340/572.7 |
| 6,313,747 B2 | 11/2001 | Imaichi | 340/572.5 |
| 6,320,556 B1 | 11/2001 | Cyman | 343/873 |
| 6,333,721 B1 | 12/2001 | Altwasser | 343/867 |
| 6,352,497 B1 | 3/2002 | Hensley | 493/22 |
| 6,353,420 B1 | 3/2002 | Chung | 343/895 |
| 6,400,323 B2 | 6/2002 | Yasukawa | 343/700 |
| 6,407,669 B1 | 6/2002 | Brown et al. | |
| 6,424,315 B1 | 7/2002 | Glenn | 343/895 |
| 6,466,131 B1 | 10/2002 | Tuttle | 340/572.7 |
| 6,476,775 B1 | 11/2002 | Oberle | 343/895 |
| 6,509,837 B1 | 1/2003 | Tuttle | 340/572.7 |
| 6,549,176 B2 | 4/2003 | Hausladen | |
| 6,693,541 B2 * | 2/2004 | Egbert | 340/572.7 |
| 6,698,116 B2 | 3/2004 | Waldron | 40/124.11 |
| 6,781,508 B2 | 8/2004 | Tuttle | 340/10.1 |
| 6,836,215 B1 | 12/2004 | Laurash | 340/572.1 |
| 6,839,029 B2 | 1/2005 | Mendolia | 343/700 |
| 6,933,892 B2 | 8/2005 | Oberle | 343/700 |
| 6,940,408 B2 | 9/2005 | Ferguson | 340/572.7 |
| 6,988,666 B2 | 1/2006 | Appalucci | 235/488 |
| 7,071,422 B2 | 7/2006 | Droz | |
| 7,078,304 B2 * | 7/2006 | Derbenwick et al. | 438/329 |
| 7,116,227 B2 | 10/2006 | Eckstein | 340/571 |
| 7,122,235 B2 | 10/2006 | Bourdelais | 428/40.1 |
| 7,176,053 B1 | 2/2007 | Dimmler | 438/93 |
| 7,224,280 B2 | 5/2007 | Ferguson | 340/572.7 |
| 7,256,738 B2 | 8/2007 | Uchibori | 343/700 |
| 7,283,035 B2 | 10/2007 | Tuttle | 340/10.1 |
| 7,284,704 B2 | 10/2007 | Lubow | 235/462.01 |
| 7,345,575 B2 | 3/2008 | Tuttle | 340/10.1 |
| 7,374,095 B2 | 5/2008 | Blank | 235/486 |
| 7,458,015 B2 | 11/2008 | Wang | 715/229 |
| 7,463,150 B2 | 12/2008 | Rajan | 340/572.1 |
| 7,477,194 B2 | 1/2009 | Coleman | 343/700 |
| 7,497,004 B2 | 3/2009 | Cote | 29/600 |
| 7,533,455 B2 | 5/2009 | Wehr | 29/600 |
| 7,621,451 B2 | 11/2009 | Berson | 235/435 |
| 7,633,035 B2 | 12/2009 | Kirmeier | 219/121.69 |
| 7,641,112 B2 | 1/2010 | Jensen | 235/380 |
| 7,650,683 B2 | 1/2010 | Forster | 29/600 |
| 7,681,301 B2 | 3/2010 | Rodgers | 29/600 |
| 7,836,588 B2 | 11/2010 | Laksin | 29/847 |
| 7,855,645 B2 | 12/2010 | Rajan | 340/572.1 |
| 7,893,385 B2 | 2/2011 | Rodgers | 219/121.69 |
| 7,930,815 B2 | 4/2011 | Coleman | 29/600 |
| 7,997,495 B2 | 8/2011 | Rodgers | 235/482 |
| 8,033,477 B2 | 10/2011 | Jones | 235/492 |
| 8,132,734 B2 | 3/2012 | Lazarowicz | 235/487 |
| 8,146,830 B2 | 4/2012 | Johnson | 235/492 |
| 8,178,028 B2 | 5/2012 | Gandhi | 264/400 |
| 8,191,230 B2 | 6/2012 | Coleman | 29/600 |
| 8,202,567 B2 | 6/2012 | Kohnle | 427/98.4 |
| 2002/0008312 A1 | 1/2002 | Sasaki et al. | |
| 2002/0018880 A1 | 2/2002 | Young | 428/209 |
| 2002/0025416 A1 | 2/2002 | Uchibori | 428/209 |
| 2003/0033713 A1 | 2/2003 | Hausladen | |
| 2003/0051806 A1 | 3/2003 | Appalucci | 156/270 |
| 2003/0112202 A1 | 6/2003 | Vogt | 343/873 |
| 2003/0136503 A1 | 7/2003 | Green | 156/264 |
| 2003/0236503 A1 | 12/2003 | Koenig | 604/201 |
| 2004/0075616 A1 | 4/2004 | Endo | 343/895 |
| 2004/0177492 A1 | 9/2004 | Eckstein | 29/602.1 |
| 2005/0001785 A1 | 1/2005 | Ferguson | 343/895 |
| 2005/0035927 A1 | 2/2005 | Kimura | 345/55 |
| 2005/0083627 A1 | 4/2005 | Wang | 361/113 |
| 2005/0089664 A1 | 4/2005 | Utz | 428/43 |
| 2005/0183817 A1 | 8/2005 | Eckstein | 156/278 |
| 2005/0197074 A1 | 9/2005 | Cullen | 455/90.3 |
| 2005/0198811 A1 | 9/2005 | Kurz | 29/601 |
| 2005/0206524 A1 | 9/2005 | Forster | 340/572.8 |
| 2005/0230486 A1 | 10/2005 | Halope | 235/492 |
| 2005/0230791 A1 | 10/2005 | Kanda | 257/668 |
| 2005/0231371 A1 | 10/2005 | Rowe | 340/572.7 |
| 2005/0274811 A1 | 12/2005 | Zercher | 235/492 |
| 2005/0284941 A1 | 12/2005 | Lubow | 235/462.01 |
| 2006/0244662 A1 | 11/2006 | Bauer | 343/700 |
| 2007/0078957 A1 | 4/2007 | Ypya | 709/222 |
| 2007/0094862 A1 | 5/2007 | Posamentier | 29/601 |
| 2007/0130754 A1 | 6/2007 | Fein | 29/600 |
| 2007/0171129 A1 | 7/2007 | Coleman | 343/700 |
| 2008/0047130 A1 | 2/2008 | Lin | 29/600 |
| 2008/0083706 A1 | 4/2008 | Kirmeier | 219/72 |
| 2008/0120834 A1 | 5/2008 | Laksin | 29/847 |
| 2008/0128397 A1 | 6/2008 | Gandhi | 219/121.69 |
| 2008/0217309 A1 | 9/2008 | Rodgers | 219/121.68 |
| 2009/0230196 A1 | 9/2009 | Johnson | 235/492 |
| 2010/0071831 A1 | 3/2010 | Peters | 156/64 |
| 2010/0320275 A1 | 12/2010 | Fu | 235/492 |
| 2011/0001670 A1 | 1/2011 | Coleman | 343/700 |
| 2011/0220276 A1 | 9/2011 | Coleman | 156/247 |
| 2012/0060359 A1 | 3/2012 | Forster | 29/601 |
| 2012/0064307 A1 | 3/2012 | Forster | 428/195.1 |
| 2012/0090877 A1 | 4/2012 | Forster | 174/250 |
| 2012/0280047 A1 | 11/2012 | Forster | 235/492 |
| 2013/0055555 A1 | 3/2013 | Forster | 29/600 |

FOREIGN PATENT DOCUMENTS

| | | |
|---|---|---|
| JP | 11-328343 | 11/1999 |
| JP | 2001-127410 | 5/2001 |
| JP | 2001-326517 | 11/2001 |
| JP | 2008-84160 | 4/2008 |
| JP | 2010-63081 | 3/2010 |
| JP | 2010-161222 | 7/2010 |
| WO | WO 03/024708 A1 | 3/2003 |
| WO | WO 03/003601 A1 | 4/2003 |
| WO | WO 03/054708 A1 | 7/2003 |
| WO | WO 03/107266 A1 | 12/2003 |
| WO | WO 2005/083627 A1 | 9/2005 |
| WO | WO 2005/089143 A2 | 9/2005 |
| WO | WO 2007/087189 A2 | 8/2007 |
| WO | WO 2009/118455 A1 | 10/2009 |

* cited by examiner

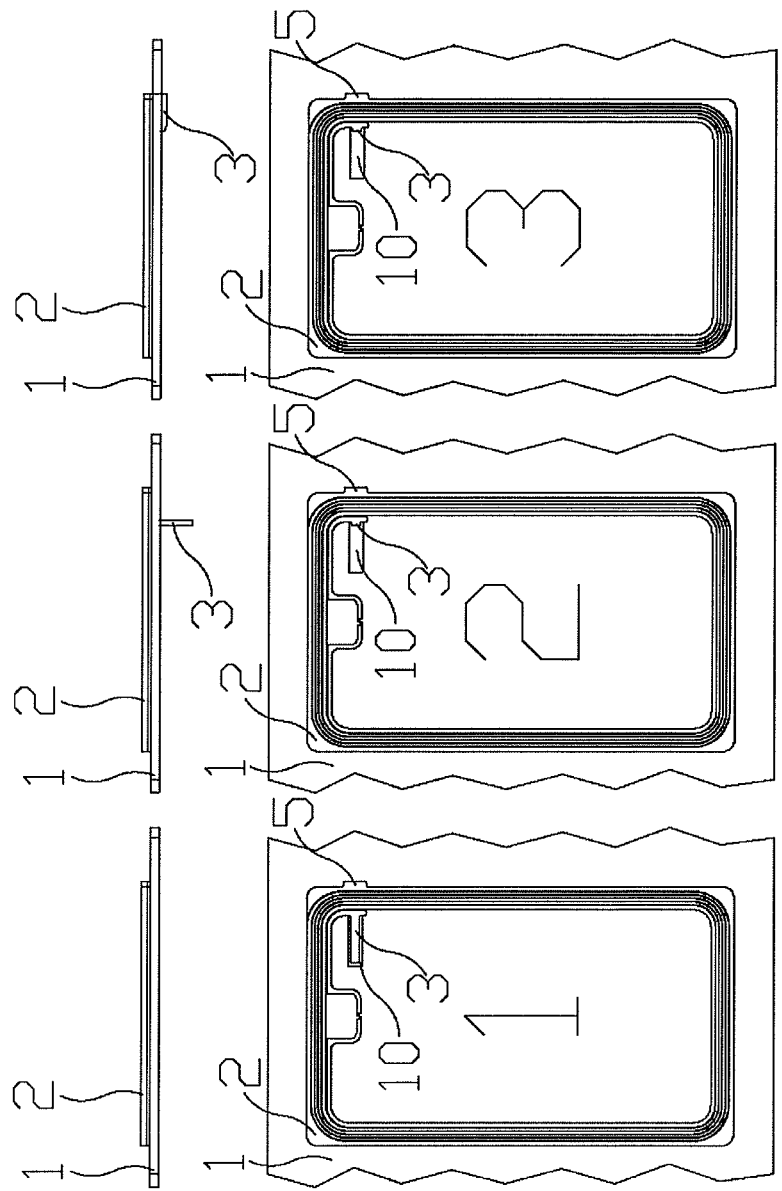

MANUFACTURING METHOD OF ELECTRICAL BRIDGES SUITABLE FOR REEL TO REEL MASS MANUFACTURING

CROSS-REFERENCE TO RELATED APPLICATIONS

The present application is a 35 U.S.C. §§371 national phase conversion of PCT/FI2012/050475, filed May 21, 2012, which claims priority of Finnish Patent Application No. 20115488, filed May 19, 2011, the contents of which are incorporated by reference herein. The PCT International Application was published in the English language.

The invention relates to the manufacture of reel to reel manufactured bridges of bendable circuit boards. By means of the method according to the invention circuits especially ones comprising an RFID antenna can be manufactured.

BACKGROUND OF THE INVENTION

In RFID antennae and other conductive patterns, there is often the need to connect conductor areas electrically with a so-called bridge, that passes over other conductor areas, which may not form an electrical contact with the bridge or through the bridge.

A typical application of the invention is a coil-like RFID antenna, wherein both ends of the antenna have to be attached to the terminals of a small microchip. When the antenna is made in planar configuration of metal foil on a substrate, one end of the antenna coil remains inside the coil and the other outside the coil. The microchip is so small that the distance between the ends of the antenna coil is greater by order of magnitude than the distance between the terminals of the microchip. In this case a bridge crossing over the coil is needed which creates an electrical contact from one end of the planar antenna coil across the other turns in the antenna coil in such a way that the terminals of the small microchip can be connected to the structure formed by the antenna coil itself and the bridge on the outside, or typically inside, of the coil.

The description below refers to this typical application, but the method is also applicable to other uses.

PRIOR ART AND PROBLEM TO BE SOLVED

There are currently two alternatives for making the bridges: 1) An insulating varnish which is hardened is printed on top of the conductor turns to be crossed over or other areas to be crossed over. A longer pattern is printed on the insulating varnish extending as far as over the areas to be connected with conductive printing ink which is hardened. Conductive printing ink, especially containing silver, is very expensive. Furthermore, its clearly poorer electroconductivity than that of foil generates greater resistance across the bridge. The mechanical strength of the structure is also relatively poor. 2) A bridge of foil is made today by etching the laminate coated with foil on both sides forming a conductive pattern also on the rear side of the substrate. The conductive patterns on different sides of the substrate, which are directed at one another, that is on one side the actual antenna and on the other side the bridge, are connected by means of so-called crimped connections through the substrate. Making the conductive pattern on both sides of the substrate increases the costs notably and the crimped connections are made mechanically with a punch tool which has to be set separately for each antenna model and is sensitive and expensive. Furthermore, this type of laminate requires another additional protective layer on the finished product so that the bridge will not remain visible or exposed to be and susceptible to damage.

Prior art patent publications may be mentioned namely DE 10052517 A1, U.S. Pat. No. 6,549,176B2 and JP2001326517A which use a strip tongue cut through the whole of the substrate. The bridge is in that case formed by folding both the conductive layer and the substrate, which requires that stage holes or incisions aligned precisely with the conductive pattern in the substrate are made in a separate process. Since the substrate is included, the foldable element is also considerably thick and solid, which means that folding requires heavy-duty tools for gripping the part to be folded. This is extremely difficult to implement especially in rapid reel to reel manufacturing. In addition, when the antenna model changes, they always have to be aligned accurately according to where the folds are on the web. After folding, the electrically connected surfaces are inconveniently between two substrate layers, which rules out many methods advantageous in reel to reel manufacture, such as ultrasonic and laser spot welding. From the point of view of the final product, the doubling of the thickness of the circuit board caused by the bridge is a significant problem and in many cases, such as smart cards, it cannot be allowed. Furthermore, the hole which forms in the substrate at the bridge is detrimental and cannot be left on the surface of the finished product. An additional protective layer is required. In addition, the holes deteriorate the reliability and durability of the finished product when the product is typically bent in use.

The U.S. Pat. No. 7,071,422B2 discloses a method, wherein a strip tongue that is unattached to the substrate is passed through flap openings made in the substrate first to the rear side and then back to the conductor side and is finally connected to the termination of the microchip. The publication does not describe how the strip tongue can be manufactured and how the passing of the thin strip tongue which is extremely sensitive to mechanical handling can be carried out in reel to reel mass manufacturing, since even in laboratory conditions, opening the flap openings and passing the foil through without the foil breaking or at least creasing is extremely difficult and slow. From the point of view of the end product, the conductor strip tongue on the rear side of the substrate and the flap openings in the substrate require an additional protective layer. In addition, the flap holes deteriorate the reliability and durability of the finished product when the product is typically bent in use.

The Applicant's patent FI 121592 B describes a method which uses selective lamination, that is, patterned gluing between the substrate and the metal foil, wherein the metal foil is patterned after the selective lamination into the desired form. This method makes it is easy to produce a foil pattern part unattached to the substrate, which can be folded, bent and threaded in order to provide different bridge solutions. However, the publications do not disclose any industrially applicable solutions, nor are any such solutions in use, by means of which a bridge could be manufactured by utilising this type of foil pattern unattached to the substrate. This is not an easy task, because the metal foil used is typically thin and easily damaged, there are typically hundreds of bridges per square meter, and this is a process where the web moves from reel to reel often and preferably continuously. The aim of the invention is to solve this problem, that is, to provide a method for manufacturing electrical bridges suitable for reel to reel mass manufacturing, which utilises foil pattern parts unattached to the substrate.

DESCRIPTION OF THE INVENTION

By means of the method according to the invention, the bridge is made either on the same side or a different side of the substrate as the actual conductive pattern. The main part of the bridge is formed by a foil strip tongue attached to the actual conductive pattern but unattached to the substrate. This gives the significant advantage that no additional material is required for the bridge, but it is made of a part of the foil which would otherwise be removed from the web and become waste or be recycled. Another significant advantage is that being attached by one edge to the actual conductive pattern, the strip tongue cut for the bridge is in precisely the correct location and no handling or positioning of a separate small piece is thus required.

When the bridge is made according to the method of the invention on the same side as the actual conductive pattern, a bridge is provided which combines the advantages of the currently used bridges based on crimped connections and printed bridges and avoids their disadvantages. On the one hand, there will be no conductive structures on the rear side of the laminate, whereupon no conductive patterns have to be made on the rear side, nor will any additional protective layers be required on the rear side of the finished product and thus the costs are significantly lower. On the other hand, the foil is much cheaper, more durable and has better electroconductivity than conductive printing ink, whereby the bridge will be cheaper, more durable and have improved electroconductivity. Unlike in the methods disclosed in publications D1 to D3, the foil alone can be folded without gripping the strip tongues, and most preferably, different circuit boards can be manufactured without making any changes in the devices carrying out the folding.

When the bridge is made according to the method of the invention on a different side than the actual conductive pattern, an advantage is achieved compared to a bridge made on the same side as the conductive pattern in that the substrate acts as insulation and no separate insulation is required. Disadvantages include the fact that, in practice, a hole has to be made in the substrate, through which the strip tongue is taken to the other side of the substrate, and that the electrical connection requires either a connection means passing through the substrate, such as a crimped connection, or making a hole in the substrate also at the other end of the bridge. A bridge folded to the other side also makes it possible to manufacture a multilayer circuit board and connections over the edge of the circuit board, for example, to the ground plane or power supply on the rear side.

The strip folded over the edge can also be made, for example, in such a way that a folding flap in the substrate is made at the incoming lead-in, or even separate piece is used, which is folded open by means of a roll while simultaneously blowing or sucking the strip tongue through the gap left by the edge of the flap, and the strip tongue can be returned in place or cut off completely, thus forming a hole. The flap may be perforated on the folding edge or there may be gaps and thin strip tongues acting as hinges at the folding point. The folding of the flap and the strip tongue can then be carried out by sucking and/or blowing at the same stage. To the method according to the patent FI 121592 described above may be added the above-mentioned making of holes or flaps for the lead-in of the substrate. However, the use of suction or blowing as disclosed above also makes possible making bridges or lead-ins through the substrate without using separately placed tools for folding the bridges. The folding can be carried out by suction or blowing alone, because a laser-machined unglued strip tongue made according to the method of FI 121592 B is definitely unattached to the substrate, contrary to a mechanically machined strip tongue which usually attaches. U.S. Pat. No. 7,071,422B2 discloses that reel to reel circuit boards cannot be manufactured without programming the devices handling the flaps and strip tongues separately for each circuit board model.

It should be noted that usually a strip folded over the edge turns the other way round than does a top strip, that is, its lower surface comes against the substrate. On the upper surface, the folded strip turns with the original upper surface downwards, whereupon an electrical contact is made between two original upper surfaces. The unattached strip tongue of a circuit board manufactured in accordance with patent FI 121592B described above does not, however, contain harmful adhesive on its rear surfaces, and it is also possible to make the foil identical on both sides. A multilayer circuit board can also be made by first folding the strips to the other side and then also forming the layout of the rear side, for example, by the method according to FI 121592 B.

In order to be cost-effective and industrially applicable, a bridge manufacturing method must be able to handle a large number per surface area of laminate and per unit of time of strip tongues consisting of thin and easily damaged metal foil, and be suitable for reel to reel processing, mostly and most preferably for a continuously moving web. This means avoiding solutions where the foil strip tongues have to be gripped, because a solution based on gripping requires a large number of rapid gripping means adaptable to changing antenna positions, and because strip tongues made of thin metal foil are extremely easily damaged or even broken if they have to be gripped. On the other hand, it is sensible to favor solutions in which the movement of the web, that is, of the laminate comprising conductive patterns, can be utilised in handling the foil strip tongues, that is, in manufacturing the bridges. The method according to the invention is based on such starting points.

BRIEF DESCRIPTION OF THE DRAWINGS

Preferred embodiments of the invention are described in the following by means of the accompanying drawings.

FIGS. 1 and 5 respectively schematically show a side and a top view of five stages of the manufacturing method according to a first embodiment of the invention.

FIGS. 4 and 6 respectively show a side and top view of three stages of the method according to a third embodiment, wherein the bridge is folded through the substrate.

DESCRIPTION OF EMBODIMENTS

Figure 1:
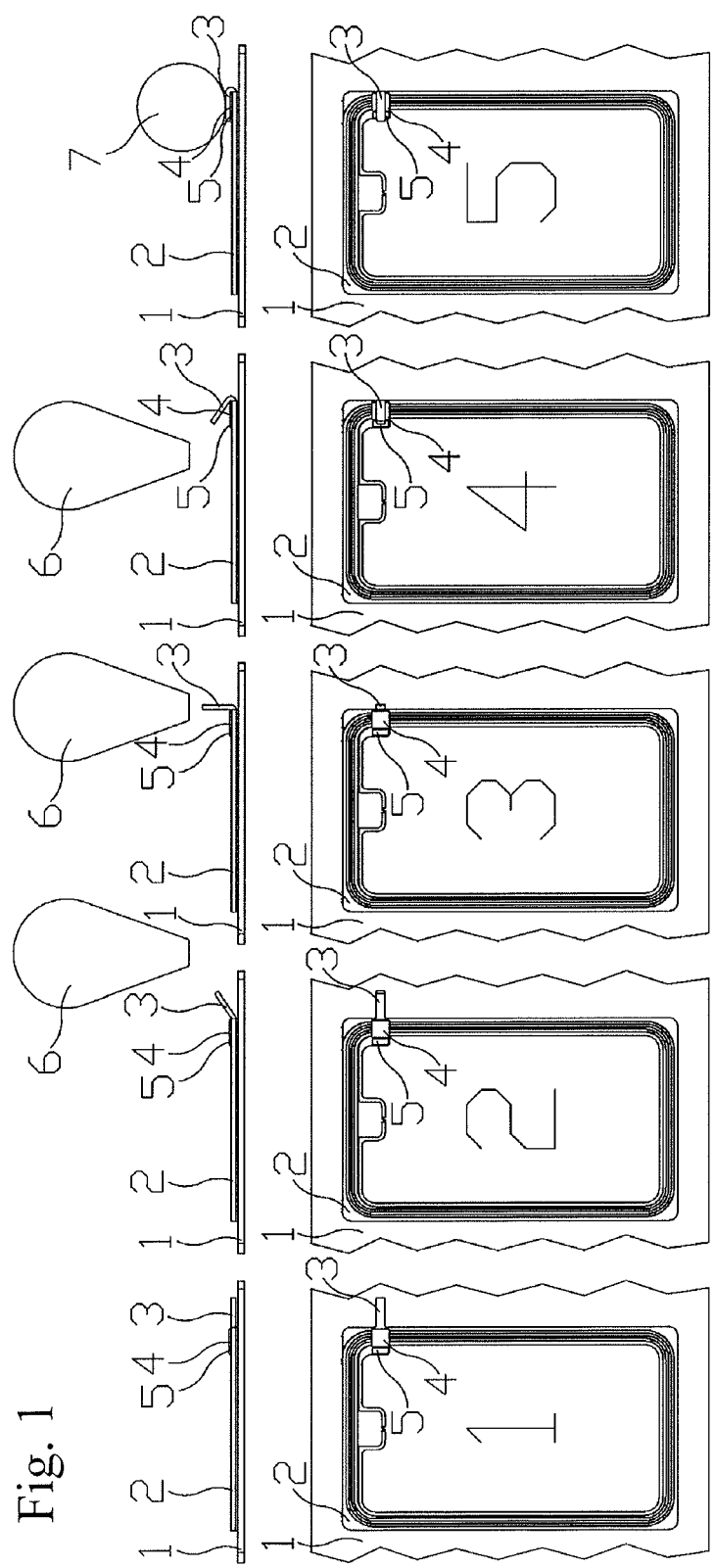
Figure 2:
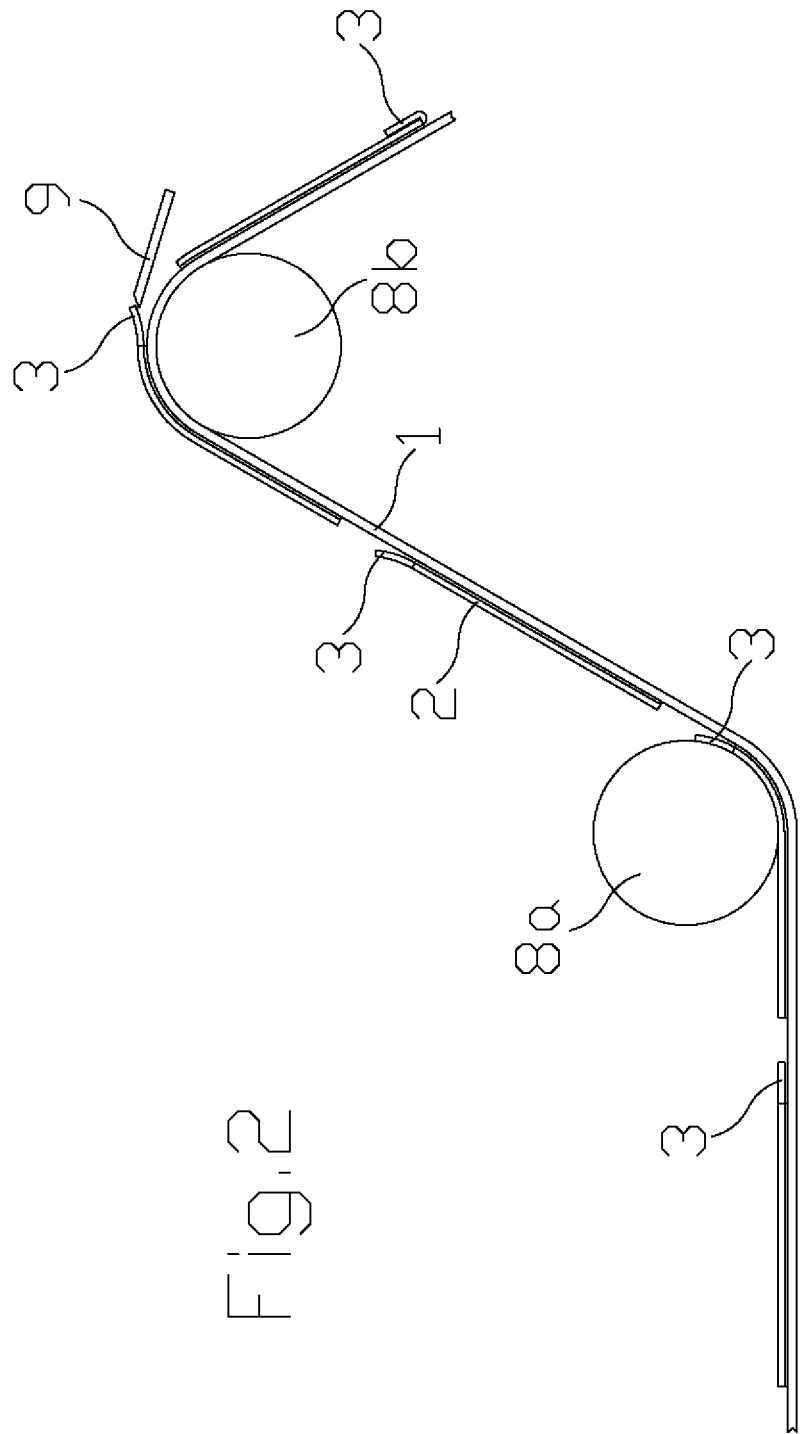
FIG. 2 schematically shows a side view of the stages of the manufacturing method according to a second embodiment of the invention.

The method and apparatus are at their simplest when the conductive patterns with their foil strip tongues are designed and positioned on the web in such a way that the foil strip tongues and their folding movements are parallel to the movement of the web in accordance with FIG. 1 or 2. The movement of the web can be utilised best if the positioning is in addition done in such a way that the free ends of the foil strip tongues 3 point in the direction of movement, that is, forward. Generally, for example with coil-like RFID antennae, it is not a problem to design and position the conductive patters and foil strip tongues in this manner.

Tests carried out with real conductive patterns with strip tongues show that a foil strip tongue unattached to the substrate follows correctly dimensioned suction in a controlled manner when the laminate comprising conductive patterns moves under the suction nozzle in such a way that the web moves with the free end of the foil strip tongue leading. This is illustrated in FIGS. 1 and 5. It is obviously irrelevant which part moves and which remains in place. When the free end of the strip tongue approaches the suction nozzle, it begins to rise from the substrate and to bend and/or fold with respect to its edge attached to the conductive pattern attached to the substrate. While the mutual movement of the laminate and the suction nozzle continues, the free end of the foil strip tongue points continuously more or less towards the suction nozzle, whereby the strip tongue can be turned by as much as 180 degrees, as shown in the series of FIG. 1. If necessary, the final folding and pressing down of the strip tongue can be ensured by means of a roll, some other type of a mechanical press or, for example, a blow head. When the actual conductive patterns and the strip tongues attached to them by one edge are dimensioned and positioned appropriately, the strip tongue can be folded controllably to cross over the desired areas of the conductive pattern. This alternative is extremely easy to carry out even with stationary actuators in connection with a continuously moving web, provided that the web travels in such a way that the free ends of the foil strip tongues point in the direction of movement.

However, if the web is moved periodically, this alternative can also be easily carried out for controlled folding of foil strip tongues pointing in other directions. Folding is easier if all foil strip tongues point in the same direction and the folding is done while the web is stationary.

It is also possible to control the air current in the suction and blast nozzles to be on and off at the desired moment of time, whereby suction can also be directed to a small area and in the desired direction. Bending can then be carried out in a corresponding manner as in FIG. 1, but in several successive stages with different nozzles in such a way that the positions of the nozzles with respect to the strip tongue correspond to the positions of the different stages in FIG. 1. The suction and/or blast nozzle can then fold the strip tongue transversely to the web in such a way that the nozzle is activated for the time that the strip tongue is in the correct position with respect to the nozzle, and suction or blasting is stopped before the strip tongue moves away from the nozzle's range. This is in order for the strip tongue not to finally bend due to the effect of the trailing edge. In reel to reel manufactured products it is, however, usually possible to arrange all bridges in the direction of travel of the web.

FIG. 1 illustrates a five stage process.

In FIG. 1, a conductive pattern 2 is made on the surface of the substrate 1 of the web. At stage 1, a part of the conductive pattern 2 has been left unattached to the substrate 1 in such a way that at stage 1, a strip tongue 3 is unattached except at one side at which it is attached to the conductive pattern 2. Before the strip tongue 3 is bent into a bridge, insulation is provided in the part that will remain under the strip tongue. The insulation covers at least the conductive patterns remaining under the bridge, which may not be in electrical contact with the bridge. The insulation may alternatively be in the strip tongue or the insulation may be a separate part which is placed between the strip tongue and the parts of the conductive pattern to be isolated from it.

The strip tongue is lifted started at stage 2 by running the web under the suction nozzle 6 in such a way that the strip tongue 3 rises and bends towards the nozzle 6 due to the effect of an air current produced by the nozzle. When the web is moved further forward (or the nozzle is moved), the strip tongue first rises up at stage 3 and then folds backwards towards an angle of more than 90 degrees from its original direction at stage 4. Stage 5 shows the final folding of the strip tongue and its fixing into place by use of a press roll 7. Instead of the press roll, a slit nozzle blasting along the surface of the web, a brush or other suitable means can also be used.

In its final position, the strip tongue 3 extends across the insulation 4 all the way to the contact area 5.

In reel to reel processing, it is also easy to utilise bending of a laminate containing conductive patterns by means of a roll, as shown in FIG. 2 moving from left to right, when the foil strip tongues are parallel to the movement of the web, and when the web is bent by means of a transverse roll 8a or a similar element in such a way that the pattern side is against the surface of the roll, bending the laminate naturally lifts the ends of the foil strip tongues 3 away, off the surface of the substrate 1. When the substrate straightens again after the turning roll, there are no forces attempting to bend the foil strip tongues that are then unattached to the substrate, but they remain bent away from the substrate. Similarly, when the web is then bent so that the substrate 1 is against the surface of the roll 8b, the bending of the laminate naturally lifts the foil strip tongues 3 off the surface of the substrate 1. The conductive pattern 2 attached to the substrate 1 follows the substrate when it bends around the roll, but there are no forces attempting to bend the foil strip tongue 3 then unattached to the substrate 1. When the foil strip tongue 3 is thus made to detach from the surface of the substrate 1, its folding can easily be continued, for example, by means of an air jet or air knife, suction, roll, soft rotating brush, a different kind of mechanical press or the like. The flexible thin foils can also be bent off the substrate by means of an electrostatic force. FIG. 2 shows bending of foil strip tongues based on folding with two rolls and a mechanical folding means 9. This principle can also be applied by using only one roll or similar bending element, and the principle is extremely suitable for use in connection with a continuously moving web.

Folding the foil strip tongues off the surface of the substrate can also be done using holes made in the substrate at their locations. Via the holes, for example, air blasting or a mechanical press can be passed through the substrate, which hits the surfaces of the foil strip tongues on the substrate side and bends or folds the foil strip tongues away from the substrate. Mechanical means penetrating the substrate can also be used. In that case, the substrate does not have to be perforated in advance. The type of position for the foil strip tongues is in this was easily provided with respect to the substrate so that it is easy to continue the folding of the strip tongues, for example, in ways described above. Penetrating the substrate is not an aim, but it may be advantageous especially if the foil strip tongues are not detached sufficiently from the substrate, for example, if gluing or cutting the patterns causes the strip tongues to adhere to the substrate.

Different combinations of the above-mentioned principles and alternatives can also be used for folding the foil strip tongues either with a straight web or a web bending over a roll or the like can also be used different combinations of the above-mentioned principles and alternatives.

FIG. 4 shows the manufacturing stages of the bridge made on the other side of the substrate from FIG. 1. At stage 1, in FIG. 4, the strip tongue 3 is in its initial position over an opening 10 cut in the substrate. The opening 10 may be cut before gluing the foil to the base, and the strip tongue is cut with a laser before the folding. At stage 2, the strip tongue is folded under the substrate, for example, by suction or blasting. At stage 3, the end of the strip tongue is connected to the connecting area 5, for example, by means of a crimped connection or through another opening made in the substrate, for example, by means of an adhesive or welded joint.

Considering the entire manufacturing process of conductive patterns and bridges, it may be appropriate to manufacture the foil strip tongues unattached to the substrate in such a way that they are first and possibly up to the moment of folding also elsewhere than on the side around which they are folded, attached to the same or an adjacent conductive pattern or other part of the foil attached to the substrate. In that case they may, for example, endure much better the removal of other loose foils from the substrate.

Considering the folding of the foil strip tongues, it may be appropriate to shape the strip tongue so as to have a different length and/or shape than an electrical bridge would as such require. If necessary, this type of strip tongue can be shaped even after folding, for example, the excess area shaped at the end of the strip tongue to facilitate folding can be removed. In some cases, such excess parts in the strip tongue may be removed automatically in further processing, for example, when the patterns are punched out of the laminate.

Figure 3:
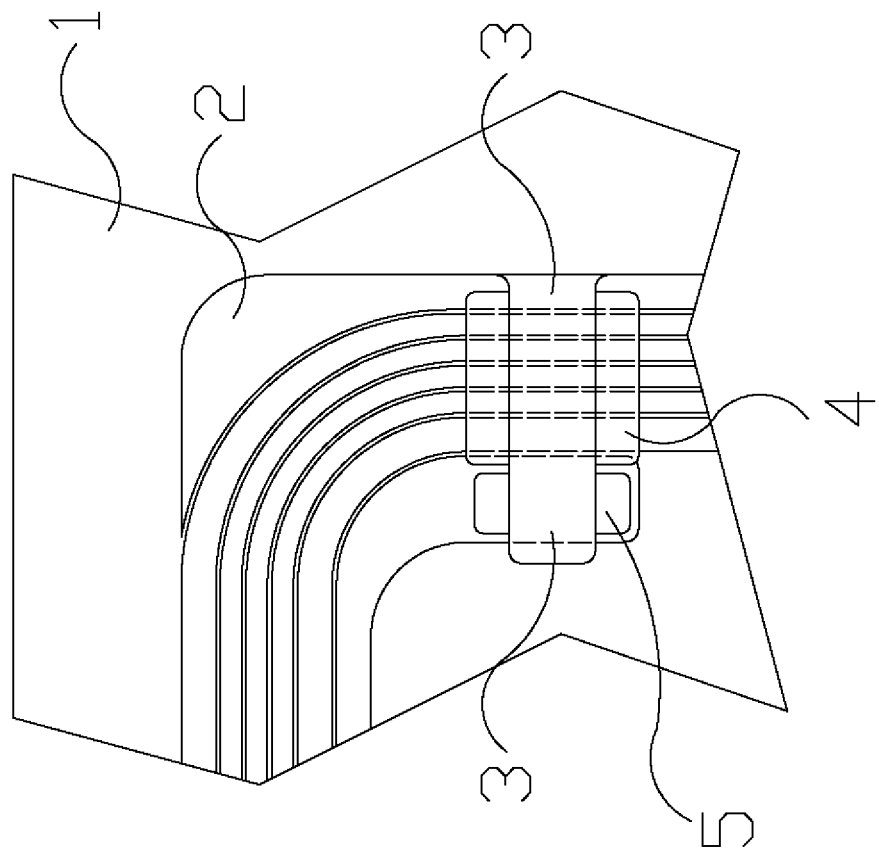
FIG. 3 schematically shows a top view of finished bridge according to the invention.

An advantageous embodiment of the method according to the invention illustrated in FIG. 3 is an antenna coil bridge of an RFID tag made by folding outwards from inside the coil. The strip tongue is in this case made of the metal foil remaining inside the coil, which is normally removed. The strip tongue can be made long, in which case the excess part remaining after the bridge has been completed can be cut off at the same time as the tag is cut off from the web. The excess part of the strip tongue may possibly be glued to a part of the web outside the tag, thus avoiding the formation of loose scrap.

When looking at the drawings, it should be remembered that they are not to scale particularly the illustrated thicknesses of the material layers are much greater than in reality.

With the alternatives described above and their combinations, it is easy to fold the foil strip tongues unattached to the substrate controllably and suitably for reel to reel mass manufacture over and/or across the conductive pattern attached to the actual substrate. In addition, electrical contacts between the folded foil strip tongues and those parts of the conductive patterns remaining under the tongues to which electrical contacts may not be made obviously have to be prevented and, on the other hand, the formation of electrical contacts between the folded strip tongues and those parts of the conductive patterns remaining under them to which electrical contacts must be made have to be ensured. It should also be ensured that the folded foil strip tongues remain in place and withstand the further processing of the laminate.

The same strip tongue may be connected electrically to several conductor areas between or beside electrically insulated areas. For example, one strip tongue may form two successive bridges which extend across areas protected by insulation. Alternatively, there may be at least two parallel contacts in one bridge, between which may still run conductors isolated from the bridge. The shape of the bridge may in addition be, for example, loop-like or u-shaped. The shape of the bridge is restricted by processability. By using preferred laser cutting, the bridge can be shaped very freely. The bridge may finally be cut into the desired shape, whereby with one folded strip tongue can be produced several different connections.

To prevent electrical contacts, an insulating layer may be pressed or printed on the upper surface of the parts of the conductive pattern to be crossed over and/or the lower surface of the foil strip tongue before folding the foil strip tongue. In its simplest form, the insulating layer can be made of the same insulating glue which is used to fix the substrate of the conductive patterns, whereby the same material carries out naturally the reliable holding in place of the folded foil strip tongue. The insulating layer may also be different, for example, pressed or printed insulating varnish, a piece of insulating tape or two-sided insulating tape or the like, as long as the insulating layer is formed before folding the foil strip tongue. The insulation may also be a self-adhesive label or any other structure which insulates electricity, which can be made to stay in place for the duration of the manufacturing stages. The insulation can obviously also be provided on the upper surface of the strip tongue before folding the strip tongue or even before cutting the strip tongue into its final form. Preferred insulations are, for example, paints or varnishes, glue mass, including hot-setting adhesive, gauzy or foil-like insulation. Gauzy insulation can be glued, for example, by impregnating glue through it. Should glue activated by heat be used, the bridge can be laminated to fix it at the same time as the final protection is laminated on the circuit, for example, when manufacturing a smart card.

The electrical contact can be achieved, for example, by means of isotropically or anisotropically conductive tape or glue which is widely used for fixing microchips, or with other sufficiently electroconductive glue. Since a conductive connection is only required at one end of the bridge and since the conductivity of the foil strip tongue is as high as that of the conductive pattern itself, the electroconductivity required of the connection is relatively low. On the other hand, if the required electrical insulation is carried out in a manner which does not fix the folded foil strip tongue in place, the foil strip tongue can be fixed in place over an even larger area than just at the electrical connection with conductive glue or the like, that is, also on the insulation layer. The electrical connection can also be made by other known methods, for example, by a crimped connection which is much easier to make and more reliable as the foils attached to one another are against each other and not on different sides of the substrate. Secondly, using a crimped connection also makes it possible to make an electrical contact through the insulating layer, such as glue or varnish, whereby the said glue or varnish can be pressed or printed over a larger area, also of electrical contact. The electrical contact can also be made by means of laser spot welding, ultrasonic welding or other welding or soldering method.

It may be advantageous to protect the bridge formed by the folded foil strip tongue with a layer provided on top of it, such as an adhesive label or varnish. The layer provided on top can also be utilised for fixing the foil strip tongue in that case no glue or other adherence is necessarily required under the foil strip tongue.

Pressing or printing glues or varnishes, placing different kinds of pieces of tape and also making crimped connections and other similar electroconductive connections are tested techniques suitable for reel to reel mass production. By combining these with the alternatives described above, by means of which the foil strip tongues unattached to the substrate are easy to fold controllably over and/or across the actual conductive patterns attached to the substrate, a manufacturing method of electrical bridges is provided which is suitable for reel to reel mass production process, and as a result reliable and highly electroconductive bridges are produced extremely cost-effectively.

The invention claimed is:

1. A reel to reel manufacturing method of electrical bridges or lead-ins over a substrate made of electrically insulating material, the method comprising:

patterning a conductive pattern from electroconductive material and at least one strip tongue made of the electroconductive material and unattached to the substrate, wherein one side of the at least one strip tongue is attached to the conductive pattern;

folding the at least one strip tongue over a folded over area of the conductive pattern such that the folded over area of the substrate is electrically insulated from the strip tongue; and connecting electro-conductively the strip tongue to a predetermined part of the conductive pattern.

2. The method as claimed in claim 1, wherein the strip tongue is folded over the conductive pattern on a same side of the substrate as the one side of the at least one strip tongue, wherein the method further comprises:

electrically insulating using the electrically insulating material between the conductive pattern and the strip tongue before the folding of the strip tongue, wherein the electrically insulating material is a printing insulating varnish or glue on the area.

3. The method as claimed in claim 1, wherein, before folding the strip tongue, the strip tongue is attached at a second location, different from the one side of the strip tongue around which the strip tongue is folded, wherein the second location is at least one the conductive pattern, an adjacent conductive pattern, a part of the foil attached to the substrate, and the substrate, and wherein the method comprises:

detaching the strip tongue at the second location before folding or in connection with the folding of the strip tongue.

4. The method as claimed claim 1, wherein a shape and size of the strip tongue is selected so as to be appropriate for folding, and wherein the strip tongue is shaped after the folding either as a separate step or in connection with another step.

5. The method as claimed in claim 1, wherein the strip tongue of has a longitudinal extent parallel to a longitudinal extent of a plurality of strip tongues of conductive patterns on top of the substrate.

6. The method of claim 5, wherein the longitudinal extent of the at least one strip tongue is parallel to a movement of a web on a production line, wherein the method further comprises:

utilizing the movement of the web on the production line in the folding of the at least one strip tongue.

7. The method as claimed in claim 1, wherein the strip tongue is folded by suction, blasting, brushing, folding the laminate around a roll, pressing the strip tongue with a roll, bar or spring, or a combination of foregoing.

8. The method as claimed in claim 1, wherein the electrical insulation is provided between the folded strip tongue and the conductors remaining under the strip tongue by printing insulating varnish or insulating glue in the desired areas.

9. The method of claim 8, further comprising connecting the at least one strip tongue to the predetermined part by gluing with insulating glue.

10. The method as claimed in claim 1, wherein the strip tongue is connected to the predetermined part isotropically or by anisotropically electroconductive glue, paste or tape.

11. The method of claim 10, further comprising fixing the at least one strip tongue to insulation over the folded over area.

12. The method as claimed in claim 1, further comprising:

after the folding, electro-conductively connecting the at least one strip tongue to a second predetermined part of the conductive pattern.

13. The method of claim 12, wherein the connecting of the at least one strip tongue to the second predetermined part is by ultrasound or laser spot welding, or is by crimped connection.

14. The method as claimed in claim 12, wherein the insulation covers the predetermined part to be connected, and connecting of the strip tongue is performed such that the connection penetrates the insulation of the conductive patterns or the insulating substrate.

15. The method as claimed in claim 1, wherein the method further comprises:

covering, with a protective layer, a finished bridge formed by the at least one strip tongue, such that the protective layer secures the finished bridge to remain in place.

16. The method of claim 15, wherein the protective layer is varnish or an adhesive label.

17. The method of claim 15, wherein the protective layer prevents adhesive of the bridge to a surface of the laminate when the laminate is reeled onto a reel.

18. The method of claim 1, wherein the at least one strip tongue is patterned from metal foil.

* * * * *